(12) United States Patent
Komatsu et al.

(10) Patent No.: US 11,837,555 B2
(45) Date of Patent: Dec. 5, 2023

(54) MODULE AND METHOD OF MANUFACTURING THE SAME

(71) Applicant: Murata Manufacturing Co., Ltd., Kyoto-fu (JP)

(72) Inventors: Toru Komatsu, Nagaokakyo (JP); Tadashi Nomura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 58 days.

(21) Appl. No.: 17/646,155

(22) Filed: Dec. 28, 2021

(65) Prior Publication Data

US 2022/0122925 A1 Apr. 21, 2022

Related U.S. Application Data

(63) Continuation of application No. PCT/JP2020/025794, filed on Jul. 1, 2020.

(30) Foreign Application Priority Data

Jul. 8, 2019 (JP) .................................. 2019-127017

(51) Int. Cl.
*H01L 23/552* (2006.01)
*H01F 27/36* (2006.01)
(Continued)

(52) U.S. Cl.
CPC ......... *H01L 23/552* (2013.01); *H01F 27/363* (2020.08); *H01F 41/005* (2013.01); *H01L 25/16* (2013.01)

(58) Field of Classification Search
CPC .... H05K 1/14; H05K 1/141–144; H05K 1/18; H05K 1/181–187; H05K 9/00;
(Continued)

(56) References Cited

U.S. PATENT DOCUMENTS 5,594,204 A * 1/1997 Taylor .................. H05K 5/0269
174/541
6,686,649 B1 * 2/2004 Mathews .............. H01L 23/552
257/659
(Continued)

FOREIGN PATENT DOCUMENTS

JP 2012-009745 A 1/2012
JP 2018-170421 A 11/2018
(Continued)

OTHER PUBLICATIONS

International Search Report issued in Application No. PCT/JP2020/025794, dated Sep. 24, 2020.
(Continued)

*Primary Examiner* — Tuan T Dinh
(74) *Attorney, Agent, or Firm* — Pearne & Gordon LLP

(57) ABSTRACT

A module includes a substrate including a first main surface, a first component mounted on the first main surface, a first sealing resin including a first upper surface, the first component being sealed with the first sealing resin, a first shield film that covers at least a part of the first upper surface of the first sealing resin, and a second shield film that covers a side surface of the first sealing resin and a side surface of the substrate. A step portion lower than the first upper surface of the first sealing resin is provided on an outer periphery of the first sealing resin. The first shield film and the second shield film are electrically connected to each other on a side surface below the step portion.

12 Claims, 18 Drawing Sheets

(51) Int. Cl.
H01F 41/00 (2006.01)
H01L 25/16 (2023.01)

(58) Field of Classification Search
CPC ......... H01L 23/00; H01L 23/29; H01L 23/31; H01L 23/552
USPC ....... 361/760, 764, 782–784, 795, 816, 818; 257/660–690
See application file for complete search history.

(56) References Cited

U.S. PATENT DOCUMENTS

| | | | |
|---|---|---|---|
| 8,779,563 B2* | 7/2014 | Brunnbauer | H01L 23/48 257/659 |
| 9,123,663 B2* | 9/2015 | Kim | H01L 23/3128 |
| 9,601,438 B2* | 3/2017 | Nomura | H01L 23/552 |
| 2011/0110057 A1 | 5/2011 | Nishikawa et al. | |
| 2016/0204073 A1* | 7/2016 | Beak | B05C 5/001 118/313 |
| 2016/0262292 A1* | 9/2016 | Kuk | H05K 1/0218 |
| 2017/0323838 A1* | 11/2017 | Otsubo | H01L 23/52 |
| 2017/0325365 A1* | 11/2017 | Kuk | H05K 9/0022 |
| 2018/0077829 A1* | 3/2018 | Yamamoto | H01L 25/0655 |
| 2018/0286796 A1 | 10/2018 | Kitazaki et al. | |
| 2019/0289758 A1 | 9/2019 | Furuya | |

FOREIGN PATENT DOCUMENTS

| | | |
|---|---|---|
| WO | 2010/021262 A1 | 2/2010 |
| WO | 2018/110397 A1 | 6/2018 |

OTHER PUBLICATIONS

Written Opinion issued in Application No. PCT/JP2020/025794, dated Sep. 24, 2020.

* cited by examiner

MODULE AND METHOD OF MANUFACTURING THE SAME

CROSS REFERENCE TO RELATED APPLICATION

This is a continuation of International Application No. PCT/JP2020/025794 filed on Jul. 1, 2020 which claims priority from Japanese Patent Application No. 2019-127017 filed on Jul. 8, 2019. The contents of these applications are incorporated herein by reference in their entireties.

BACKGROUND OF THE DISCLOSURE

Field of the Disclosure

The present disclosure relates to a module and a method of manufacturing the same.

Description of the Related Art

Japanese Patent Laying-Open No. 2012-9745 (PTL 1) describes a semiconductor device. In this semiconductor device, an electronic component is mounted on a substrate, and a sealing resin is formed on the substrate to seal the electronic component. A shield layer is formed in grids to cover a part of the sealing resin.

PTL 1: Japanese Patent Laying-Open No. 2012-9745

BRIEF SUMMARY OF THE DISCLOSURE

In a module disclosed in PTL 1, an inductor may be employed as the electronic component. In this case, when a current flows through the inductor, magnetic lines of force are generated and reach a shield film. An eddy current flows through the shield film with the magnetic lines of force being defined as a central axis. The eddy current generates magnetic field to cancel magnetic field generated by the magnetic lines of force. Therefore, the magnetic field generated by the eddy current may lower electrical characteristics of the inductor. In particular, when the module is reduced in profile, a distance between the inductor and a shield layer is shorter, and hence influence by the eddy current increases and the electrical characteristics of the inductor are further lowered. In the conventional shield film in grids, a looped path through which a current flows is readily secured in a shape of the shield film. Therefore, disadvantageously, flow of the eddy current is likely and generation of the eddy current is not successfully suppressed.

The conventional shield film in grids is manufactured with the use of an integrated substrate. In a state of the integrated substrate, a shield film that covers an upper surface of a sealing resin may be formed, the shield film may be processed into grids, and then the integrated substrate may be divided into individual modules. Division into individual modules, however, leads to exposure of a side surface as being not covered with the shield film and hence a shield film that covers the side surface should additionally be formed after division. In this case, whether or not connection between the shield film that covers the side surface and the shield film that covers the upper surface can satisfactorily be established becomes an issue.

In dividing the integrated substrate into individual modules, in order to avoid formation of a new shield film that covers the shield film already formed in grids on the upper surface at the time of formation of a shield film that will subsequently cover the side surface, a sheet is bonded onto the shield film in grids on the upper surface with the use of an adhesive. Then, division is done by processing using a dicer blade or laser processing, with the sheet being bonded. In processing for division, the adhesive for the sheet may drip down a side surface. While the adhesive drips down the side surface, a cut plane of the shield film formed on the upper surface is covered with the adhesive. Even when a shield film that covers the side surface is formed, the shield film that covers the side surface cannot satisfactorily be connected to the shield film that covers the upper surface. In other words, defective connection occurs.

An object of the present disclosure is to provide a module capable of preventing defective connection between shield films due to drip of an adhesive down a side surface and a method of manufacturing the same.

In order to achieve the object, a module based on the present disclosure includes a substrate including a first main surface, a first component mounted on the first main surface, a first sealing resin including a first upper surface, the first component being sealed with the first sealing resin, a first shield film that covers at least a part of the first upper surface of the first sealing resin, and a second shield film that covers a side surface of the first sealing resin and a side surface of the substrate. A step portion lower than the first upper surface of the first sealing resin is provided on an outer periphery of the first sealing resin. The first shield film and the second shield film are electrically connected to each other on a side surface below the step portion. Preferably, the first component is an inductor and the first shield film includes a striped portion in the first upper surface of the first sealing resin.

According to the present disclosure, lowering in electrical characteristics of an inductor due to magnetic field created by an eddy current can be suppressed. Furthermore, the step portion is provided on the outer periphery of the first sealing resin. Therefore, even when the adhesive for the protective sheet drips down a side surface in division of an integrated substrate into individual modules, the drip portion can remain above the step portion. Since the first shield film and the second shield film are joined to each other below the step portion, defective connection between the shield films due to drip of the adhesive down the side surface can be prevented.

DETAILED DESCRIPTION OF THE DISCLOSURE

Figure 1:
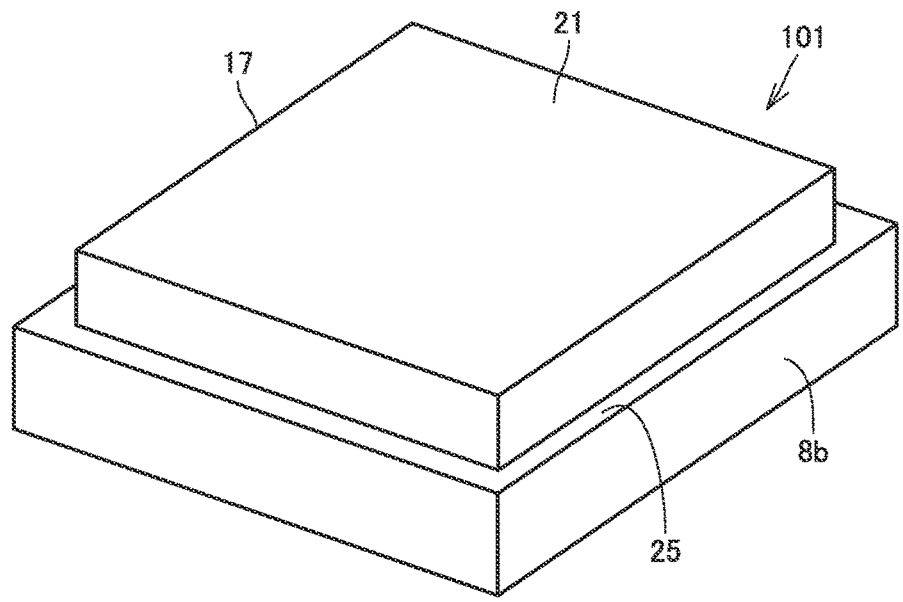
FIG. 1 is a perspective view of a module in a first embodiment based on the present disclosure.

A dimensional ratio shown in the drawings does not necessarily faithfully represent an actual dimensional ratio and a dimensional ratio may be exaggerated for the sake of convenience of description. A concept up or upper or down or lower mentioned in the description below does not mean absolute up or upper or down or lower but may mean relative up or upper or down or lower in terms of a shown position.

First Embodiment

A module in a first embodiment based on the present disclosure will be described with reference to FIGS. 1 to 5.

Figure 2:
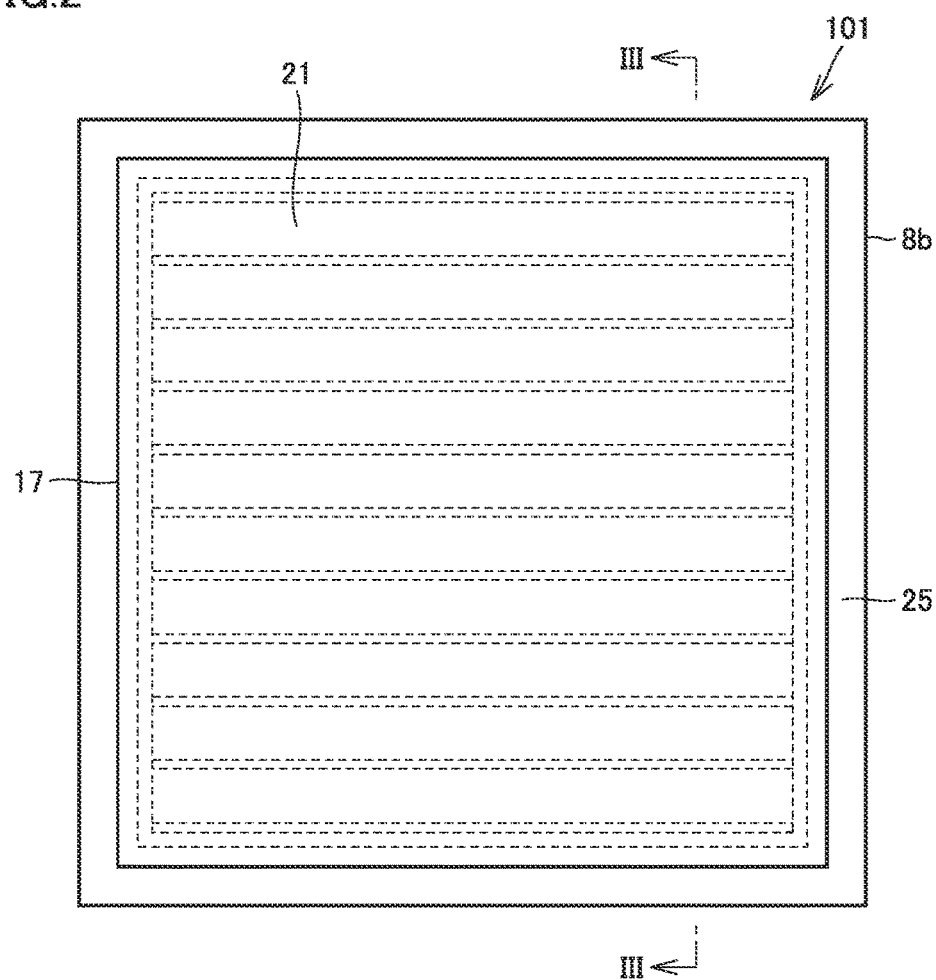
FIG. 2 is a plan view of the module in the first embodiment based on the present disclosure.
Figure 3:
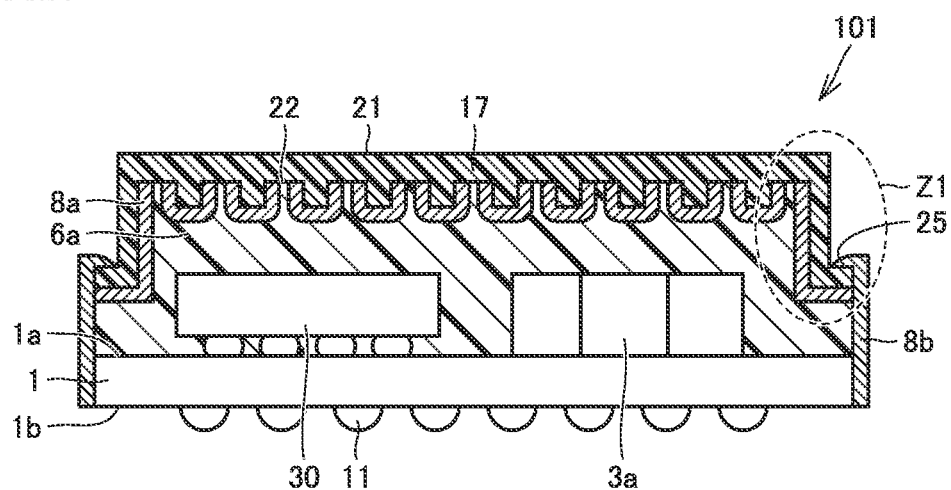
FIG. 3 is a cross-sectional view along arrows III-III in FIG. 2.
Figure 4:
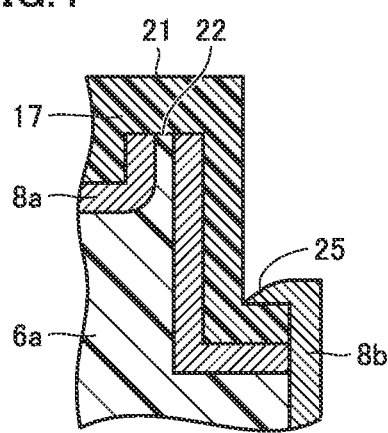
FIG. 4 is an enlarged view of a Z1 portion in FIG. 3.

FIG. 1 shows an appearance of a module 101 in the present embodiment. Module 101 includes a resin protective layer 17. Module 101 includes a module upper surface 21. In the example shown here, module upper surface 21 is a wide flat surface in the center. Resin protective layer 17 is exposed at module upper surface 21. Module 101 includes a step portion 25 that surrounds an outer periphery. Module 101 includes a second shield film 8b that covers side surfaces around the entire periphery. FIG. 2 shows a plan view of module 101. FIG. 3 shows a cross-sectional view along arrows III-III in FIG. 2. FIG. 4 shows an enlarged view of a Z1 portion in FIG. 3.

Module 101 includes a substrate 1 including a first main surface 1a, a first component 3a mounted on first main surface 1a, a first sealing resin 6a including a first upper surface 22, first component 3a being sealed with first sealing resin 6a, a first shield film 8a that covers at least a part of first upper surface 22 of first sealing resin 6a, and second shield film 8b that covers a side surface of first sealing resin 6a and a side surface of substrate 1. For example, an inductor is provided as first component 3a. First upper surface 22 is provided with surface irregularities. On an outer periphery of first sealing resin 6a, step portion 25 lower than first upper surface 22 of first sealing resin 6a is provided. First shield film 8a and second shield film 8b are electrically connected to each other on a side surface below step portion 25. First shield film 8a includes a striped portion in first upper surface 22 of first sealing resin 6a.

Resin protective layer 17 covers first shield film 8a. At step portion 25 of first sealing resin 6a, first shield film 8a covers the upper surface of first sealing resin 6a and resin protective layer 17 covers first shield film 8a. Second shield film 8b extends along the side surface of first sealing resin 6a and is formed to cover an exposed surface of first shield film 8a and to extend as far as the upper surface of step portion 25.

Resin protective layer 17 is preferably formed of a colored resin such as a black resin or a blue resin. Any printing may be done on resin protective layer 17. Printing on resin protective layer 17 may be done by laser machining. Printing on resin protective layer 17 may be done by machining a groove in an upper surface of resin protective layer 17, coloring, or exposing a rust prevention layer of an underlying shield film by providing an opening that passes through resin protective layer 17.

The upper surface of first sealing resin 6a at step portion 25 may be located, for example, at a position lower by several hundred micrometers than the upper surface of first sealing resin 6a at first upper surface 22.

Substrate 1 includes a second main surface 1b as a surface opposite to first main surface 1a. An external electrode 11 is arranged on second main surface 1b. For example, a solder ball may be provided as external electrode 11. Substrate 1 is a wiring board. Substrate 1 may be formed from a stack. Substrate 1 may contain a conductor pattern. Though substrate 1 is, for example, a ceramic substrate, it may be a resin substrate. Alternatively, substrate 1 may be formed with a redistribution layer technique used in semiconductor packaging.

Figure 5:
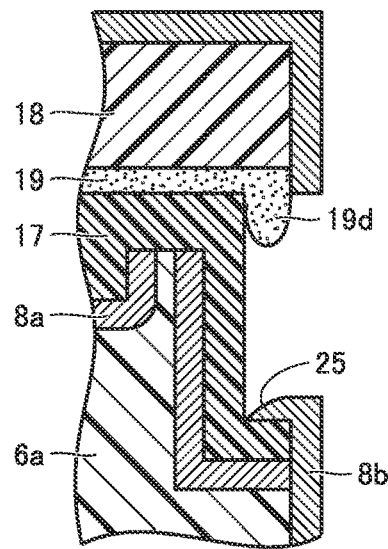
FIG. 5 is a partial cross-sectional view of a state before peel-off of a protective sheet.

In connection with an area shown in FIG. 4, FIG. 5 shows a stage before obtaining the state in FIG. 4. FIG. 5 shows a state before peel-off of a protective sheet 18. When the whole shield film is formed from combination of partial shield films formed in two or more separate steps, several steps are performed with protective sheet 18 being bonded as such. Details of a method of manufacturing a module will be described later. Second shield film 8b also covers an upper surface and a side surface of protective sheet 18. A drip portion 19d of an adhesive layer 19 extends downward below protective sheet 18. A shape of drip portion 19d in FIG. 5 is merely schematically shown, and it is not necessarily in a shape as illustrated. A lower end of drip portion 19d is located above step portion 25.

In the present embodiment, step portion 25 lower than first upper surface 22 of first sealing resin 6a is provided on the outer periphery of first sealing resin 6a. Therefore, even when the adhesive for the protective sheet drips down the side surface in division of the integrated substrate into individual modules, the drip portion can remain above step portion 25. Since first shield film 8a and second shield film 8b are joined to each other below step portion 25, defective connection between the shield films due to drip of the adhesive down the side surface can be prevented.

In the present embodiment, first shield film 8a includes a striped portion in first upper surface 22 of first sealing resin 6a. This portion, however, does not have a closed loop structure in which a flow of an eddy current is likely. Therefore, generation of the eddy current in first shield film 8a can be suppressed. In order to make such a striped portion, conveniently, a step of forming a shield film is divided into two steps, and in a second step of forming the shield film, protective sheet 18 is used. In using protective sheet 18, drip of an adhesive in division of an integrated substrate into individual modules is a concern. By providing step portion 25 as shown in the present embodiment, however, defective connection between the shield films due to drip of the adhesive down the side surface can significantly be prevented.

In the present embodiment, as shown in FIG. 2, first shield film 8a is striped over the entire first upper surface 22, however, this is merely by way of example. First shield film 8a may be striped only over first component 3a which is a part of first upper surface 22.

First shield film 8a and second shield film 8b are both formed of a conductive material. First shield film 8a and second shield film 8b may be formed of a metal. First shield film 8a and second shield film 8b may be formed of an identical material or materials different from each other.

Second Embodiment

Figure 6:
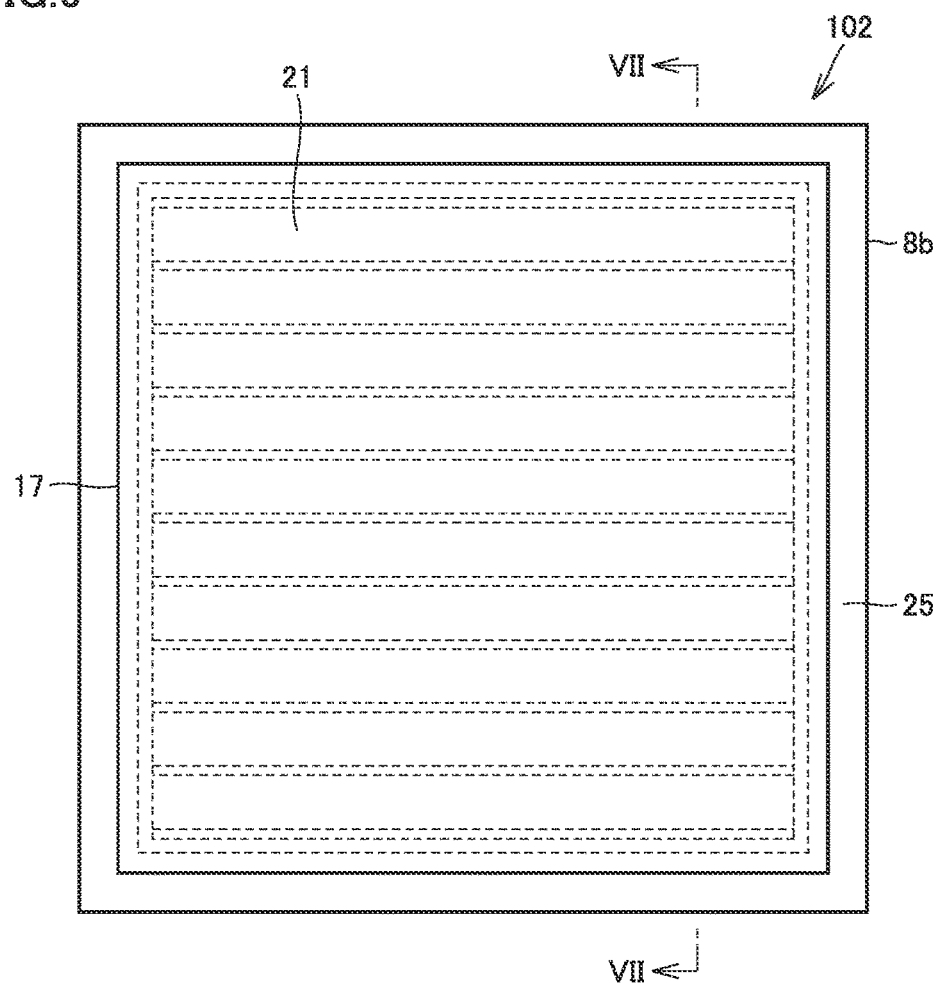
FIG. 6 is a plan view of a module in a second embodiment based on the present disclosure.
Figure 7:
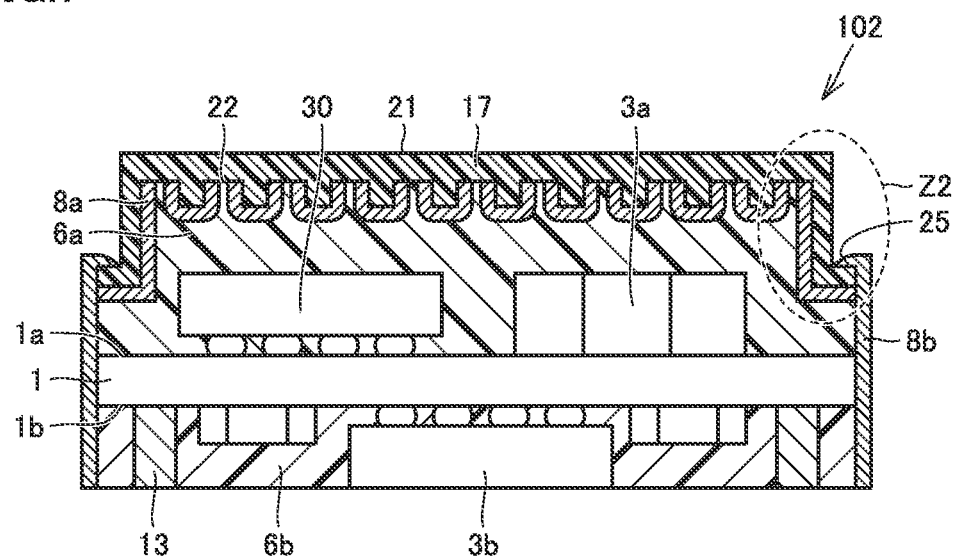
FIG. 7 is a cross-sectional view along arrows VII-VII in FIG. 6.

A module in a second embodiment based on the present disclosure will be described with reference to FIGS. 6 and 7. FIG. 6 shows a plan view of a module 102 in the present embodiment. FIG. 7 shows a cross-sectional view along arrows VII-VII in FIG. 6. Module 102 is similar in basic construction to module 101 described in the first embodiment. An enlarged view of a Z2 portion in FIG. 7 is the same as the enlarged view shown in FIG. 4.

In module 102, substrate 1 includes second main surface 1b on the side opposite to first main surface 1a. A second component 3b is mounted on second main surface 1b. A second sealing resin 6b is arranged to cover second main surface 1b and second component 3b. Second shield film 8b covers a side surface of second sealing resin 6b. In other words, module 102 has what is called a double-sided mounting structure. A columnar conductor 13 is arranged on second main surface 1b. Columnar conductor 13 passes through second sealing resin 6b in a direction of thickness. Second main surface 1b of substrate 1 and a lower surface of second sealing resin 6b are electrically connected to each other through columnar conductor 13.

Since module 102 has the double-sided mounting structure in the present embodiment, a larger number of components can be mounted on substrate 1 limited in area.

Third Embodiment

Figure 8:
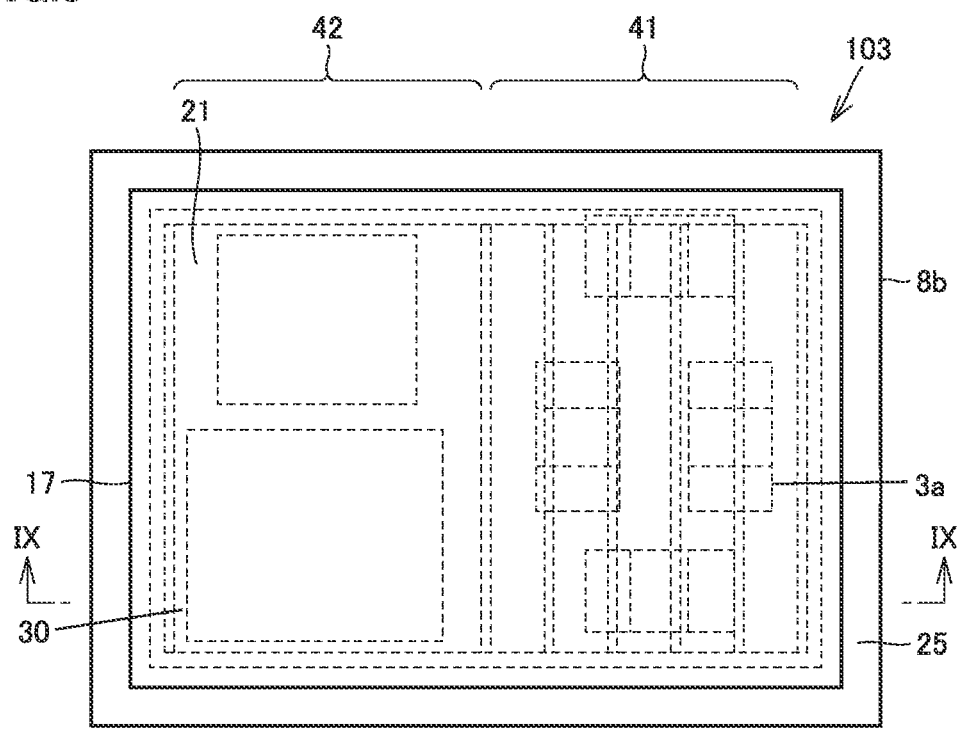
FIG. 8 is a plan view of a module in a third embodiment based on the present disclosure.
Figure 9:
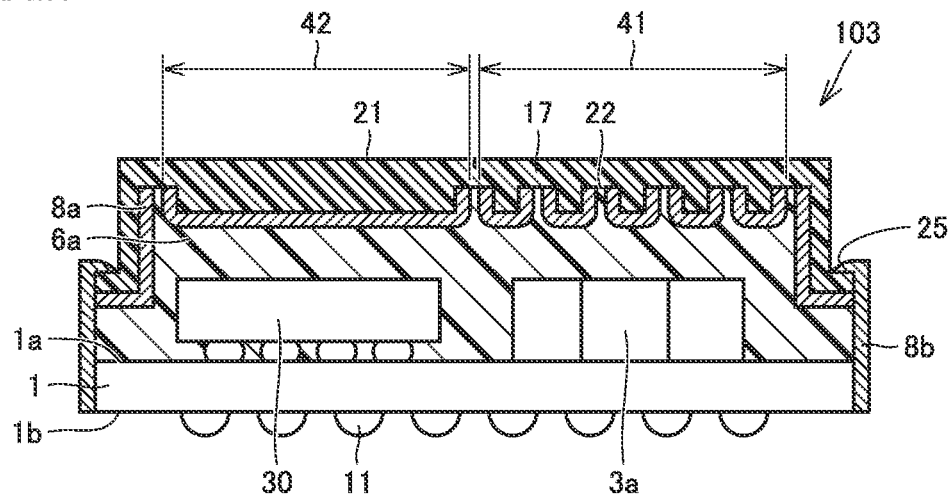
FIG. 9 is a cross-sectional view along arrows IX-IX in FIG. 8.

A module in a third embodiment based on the present disclosure will be described with reference to FIGS. 8 and 9. FIG. 8 shows a plan view of a module 103 in the present embodiment. FIG. 9 shows a cross-sectional view along arrows IX-IX in FIG. 8. Module 103 is similar in basic construction to module 101 described in the first embodiment.

In module 103, first shield film 8a includes in first upper surface 22 of first sealing resin 6a, a portion 42 where a conductor film is formed all over. Portion 42 where the conductor film is formed all over is also called a solid-fill portion 42. Module 103 includes both of solid-fill portion 42 and a striped portion 41. Solid-fill portion 42 may be provided also in an area where generation of an eddy current does not have to be suppressed.

The "solid-fill portion" can also be expressed as a portion formed to two-dimensionally spread. The "solid-fill portion" may be in a rectangular shape or in another shape.

In the present embodiment, first shield film 8a includes solid-fill portion 42. External electromagnetic interference can more reliably be prevented in solid-fill portion 42 and hence shielding can be securer.

Fourth Embodiment

Figure 10:
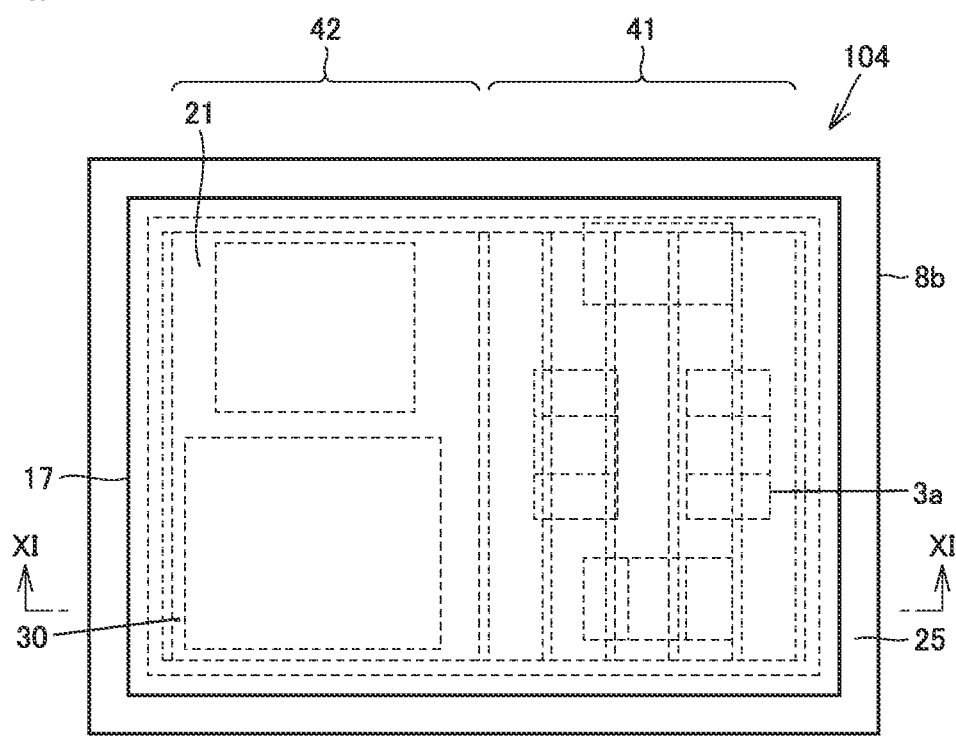
FIG. 10 is a plan view of a module in a fourth embodiment based on the present disclosure.
Figure 11:
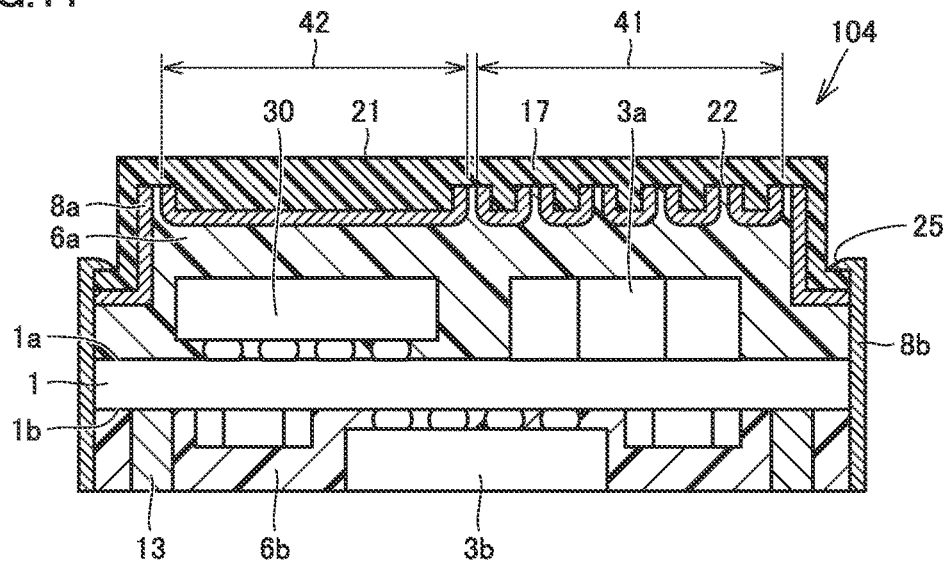
FIG. 11 is a cross-sectional view along arrows XI-XI in FIG. 10.

A module in a fourth embodiment based on the present disclosure will be described with reference to FIGS. 10 and 11. FIG. 10 shows a plan view of a module 104 in the present embodiment. FIG. 11 shows a cross-sectional view along arrows XI-XI in FIG. 10. Module 104 is similar in basic construction to module 103 described in the third embodiment. Unlike module 103, module 104 has the double-sided mounting structure.

In the present embodiment, first shield film 8a includes solid-fill portion 42 and the module has the double-sided mounting structure. Therefore, effects described in the second and third embodiments can both be obtained in the present embodiment.

Fifth Embodiment

Figure 12:
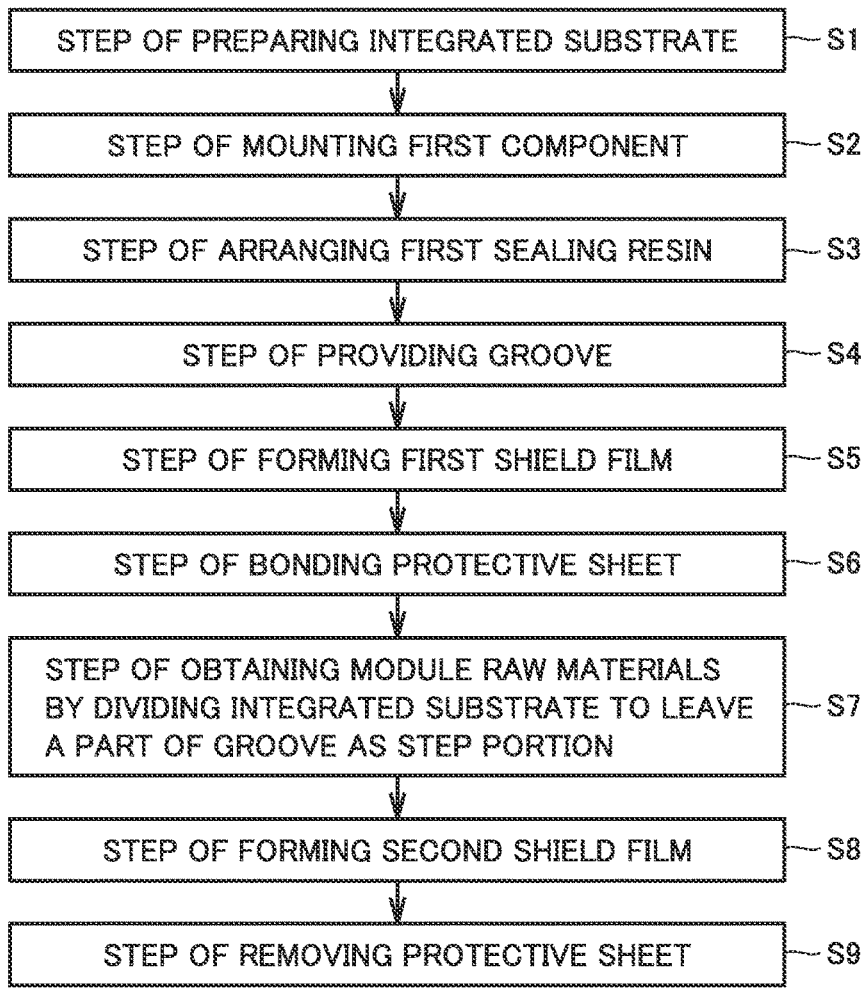
FIG. 12 is a flowchart of a method of manufacturing a module in a fifth embodiment based on the present disclosure.

A method of manufacturing a module in a fifth embodiment based on the present disclosure will be described with reference to FIGS. 12 to 24. FIG. 12 shows a flowchart of the method of manufacturing a module in the present embodiment.

The method of manufacturing a module in the present embodiment includes a step S1 of preparing an integrated substrate including a first main surface, a step S2 of mounting a first component on the first main surface of the integrated substrate, a step S3 of arranging a first sealing resin to cover the first main surface and the first component, a step S4 of providing a groove in an upper surface of the integrated substrate along a line that defines a boundary between individual substrates, a step S5 of forming a first shield film to cover at least a part of the upper surface of the integrated substrate, a step S6 of bonding a protective sheet onto the upper surface of the integrated substrate with an adhesive, a step S7 of obtaining a plurality of module raw materials each including a step portion on an outer periphery of the first sealing resin by dividing the integrated substrate to leave a part of the groove as the step portion, a step S8 of forming a second shield film to cover the first sealing resin and the protective sheet in each of the plurality of module raw materials, and a step S9 of removing the protective sheet from each of the plurality of module raw materials.

Each step will be described in detail below with reference to the drawings. An example for manufacturing module 101 described in the first embodiment will be explained by way of example.

Figure 13:
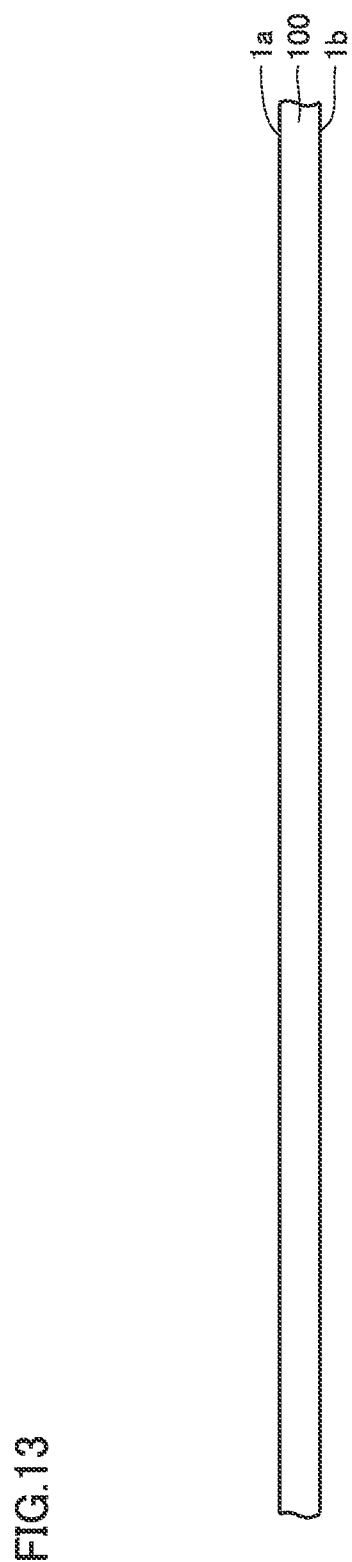
FIG. 13 is an illustrative view of a first step in the method of manufacturing a module in the fifth embodiment based on the present disclosure.
Figure 14:
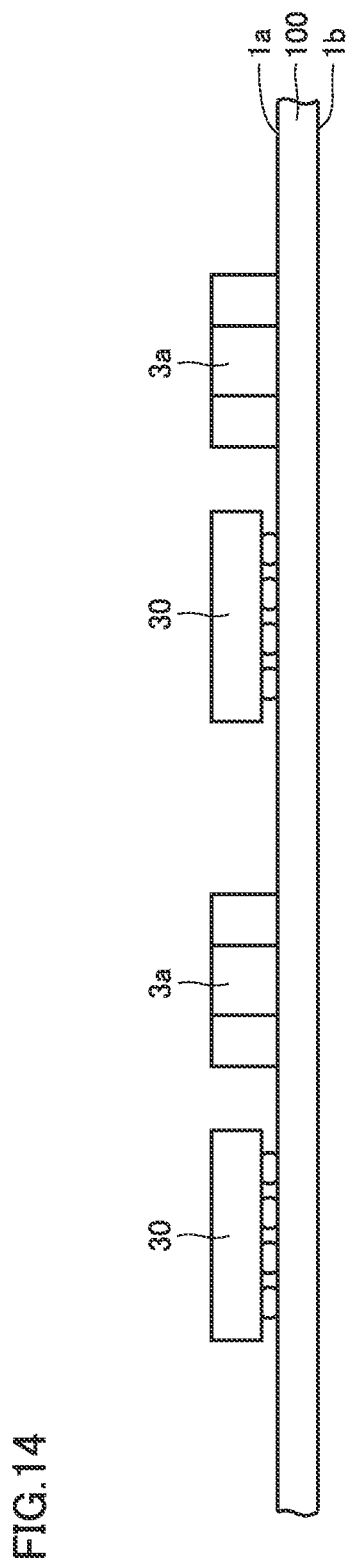
FIG. 14 is an illustrative view of a second step in the method of manufacturing a module in the fifth embodiment based on the present disclosure.
Figure 15:
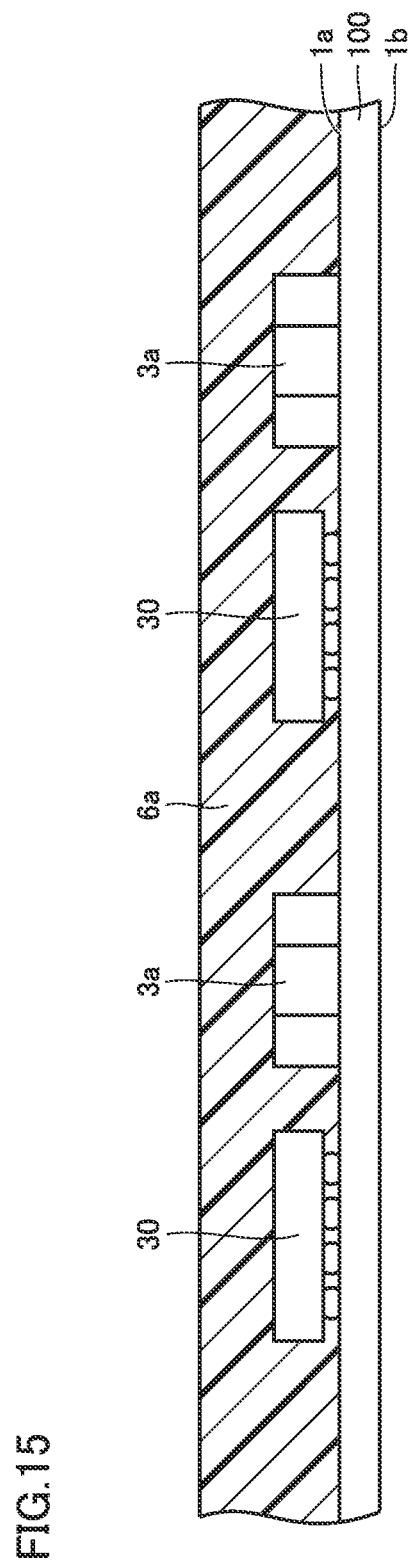
FIG. 15 is an illustrative view of a third step in the method of manufacturing a module in the fifth embodiment based on the present disclosure.

Initially, in step S1, as shown in FIG. 13, an integrated substrate 100 including first main surface 1a is prepared. In step S2, as shown in FIG. 14, first component 3a is mounted on first main surface 1a of integrated substrate 100. In addition to first component 3a, any component may also be mounted. In the example shown in FIG. 14, a component 30 is mounted. In step S3, as shown in FIG. 15, first sealing resin 6a is arranged to cover first main surface 1a and first component 3a. The "integrated substrate" below refers not only to integrated substrate 100 but also a structure itself including components formed on the upper surface and the like of integrated substrate 100.

Figure 16:
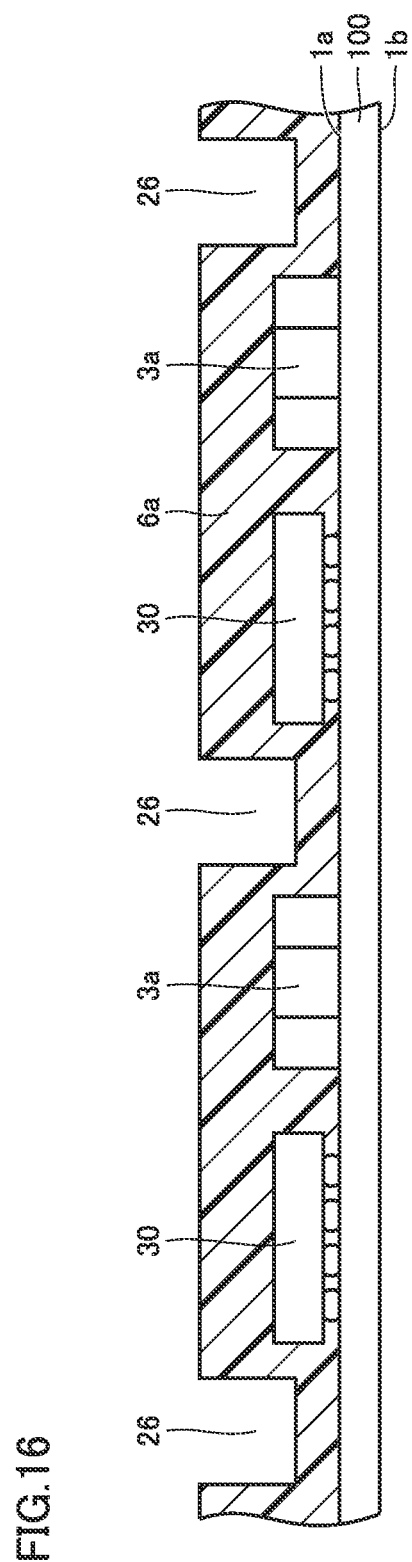
FIG. 16 is an illustrative view of a fourth step in the method of manufacturing a module in the fifth embodiment based on the present disclosure.
Figure 17:
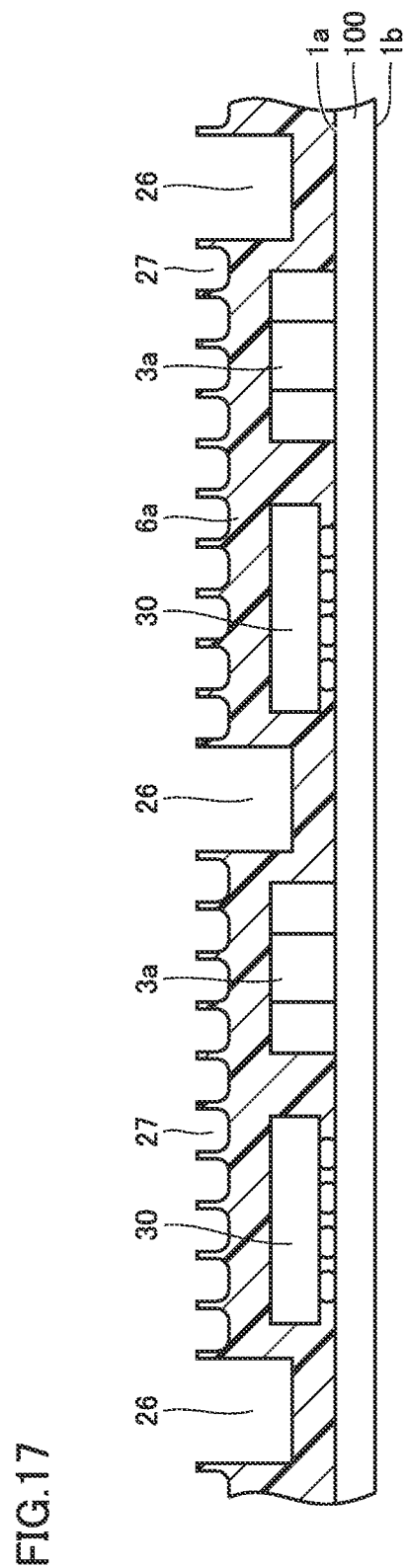
FIG. 17 is an illustrative view of a fifth step in the method of manufacturing a module in the fifth embodiment based on the present disclosure.

In step S4, as shown in FIG. 16, a groove 26 is provided in first sealing resin 6a along a line that defines a boundary between individual substrates in the upper surface of the integrated substrate. Groove 26 can be provided by dicer machining or laser machining. Groove 26 is provided along an intended division line. As shown in FIG. 17, a groove 27 is further provided in the upper surface of first sealing resin 6a. Groove 27 is provided to form a shield film in stripes. A plurality of grooves 27 are provided in stripes. Groove 27 is shallower than groove 26. Groove 27 may be provided to run completely across an area corresponding to one module from one end to the other end.

Figure 18:
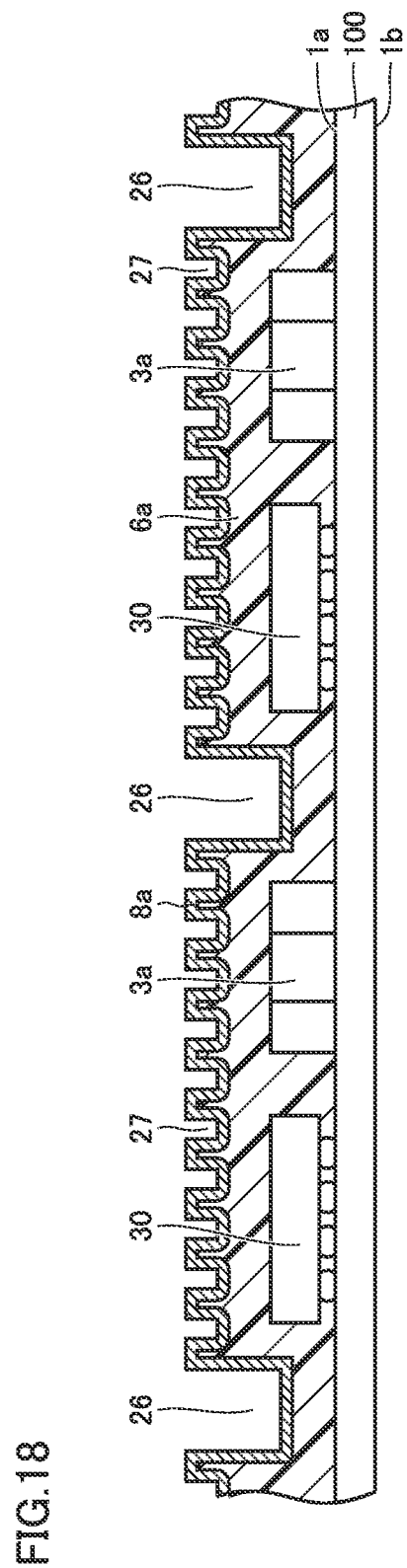
FIG. 18 is an illustrative view of a sixth step in the method of manufacturing a module in the fifth embodiment based on the present disclosure.
Figure 19:
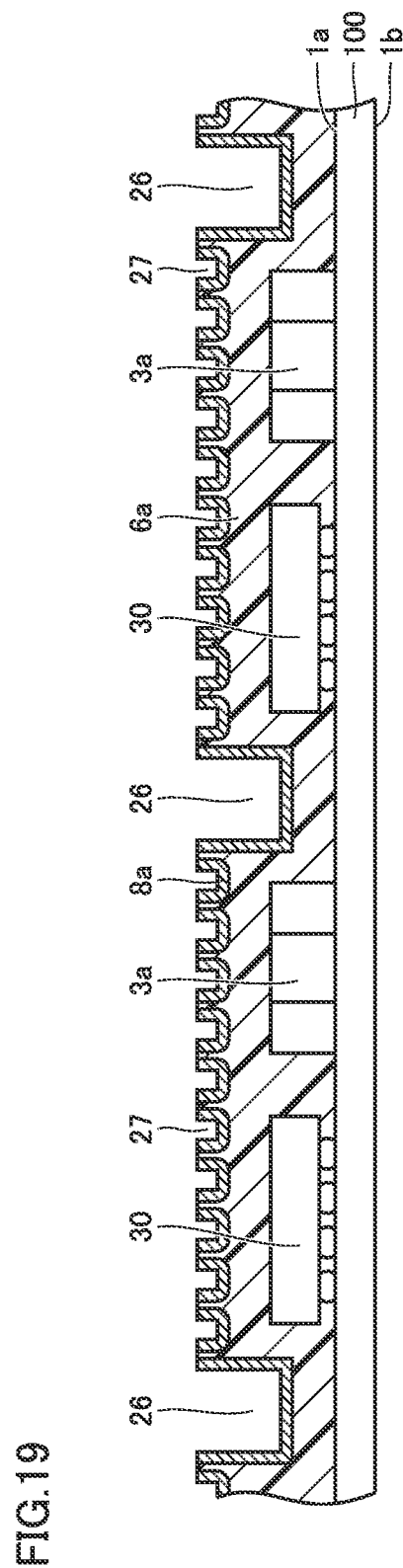
FIG. 19 is an illustrative view of a seventh step in the method of manufacturing a module in the fifth embodiment based on the present disclosure.
Figure 20:
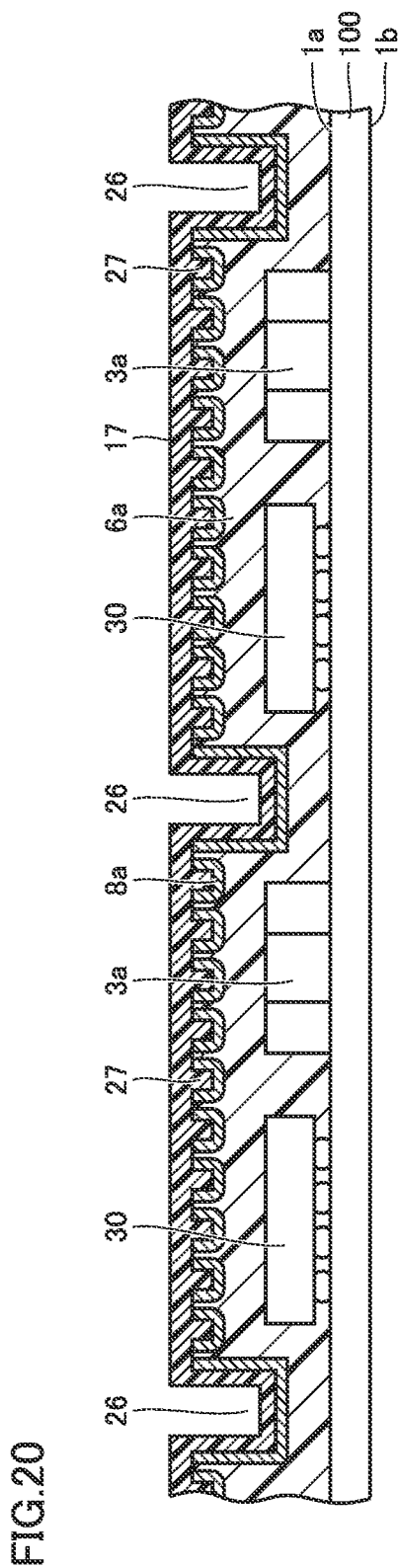
FIG. 20 is an illustrative view of an eighth step in the method of manufacturing a module in the fifth embodiment based on the present disclosure.

In step S5, as shown in FIG. 18, first shield film 8a is formed to cover at least a part of the upper surface of the integrated substrate. First shield film 8a may be composed, for example, of Cu. First shield film 8a is not necessarily formed from a single layer but may be formed from a stack including a plurality of layers including combination of a conductive layer and another layer. First shield film 8a may include a rust prevention layer. The rust prevention layer may be composed of Ni, Cr, or Ti or an alloy of two or more metals selected from among them. The rust prevention layer may be composed, for example, of SUS. As shown in FIG. 19, the upper surface of the integrated substrate is polished. An unnecessary portion of first shield film 8a is removed by polishing. A remaining portion of first shield film 8a is striped in a plan view. As shown in FIG. 20, resin protective layer 17 is formed. Resin protective layer 17 is formed to cover an inner surface of groove 26. Groove 27 is buried with resin protective layer 17. A part of resin protective layer 17 is removed as necessary in a portion corresponding to groove 26 to put groove 26 in shape. When groove 26 is buried with resin protective layer 17 by forming resin protective layer 17, groove 26 may be formed again by removing a part of resin protective layer 17.

Figure 21:
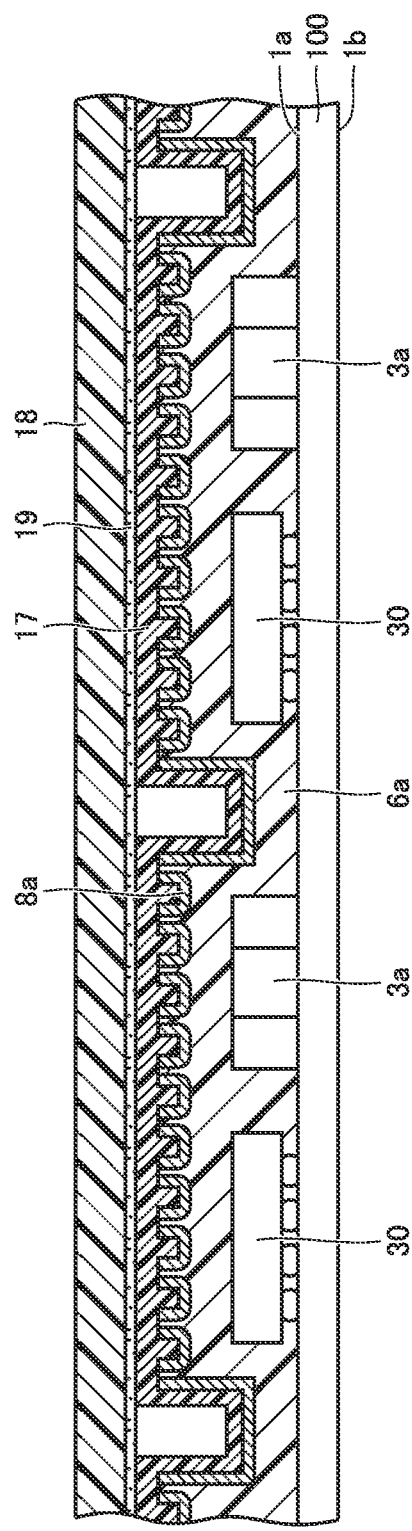
FIG. 21 is an illustrative view of a ninth step in the method of manufacturing a module in the fifth embodiment based on the present disclosure.

In step S6, as shown in FIG. 21, protective sheet 18 is bonded to the upper surface of the integrated substrate with an adhesive. Adhesive layer 19 is thus formed below protective sheet 18. Protective sheet 18 may be formed, for example, from a dicer tape.

Figure 22:
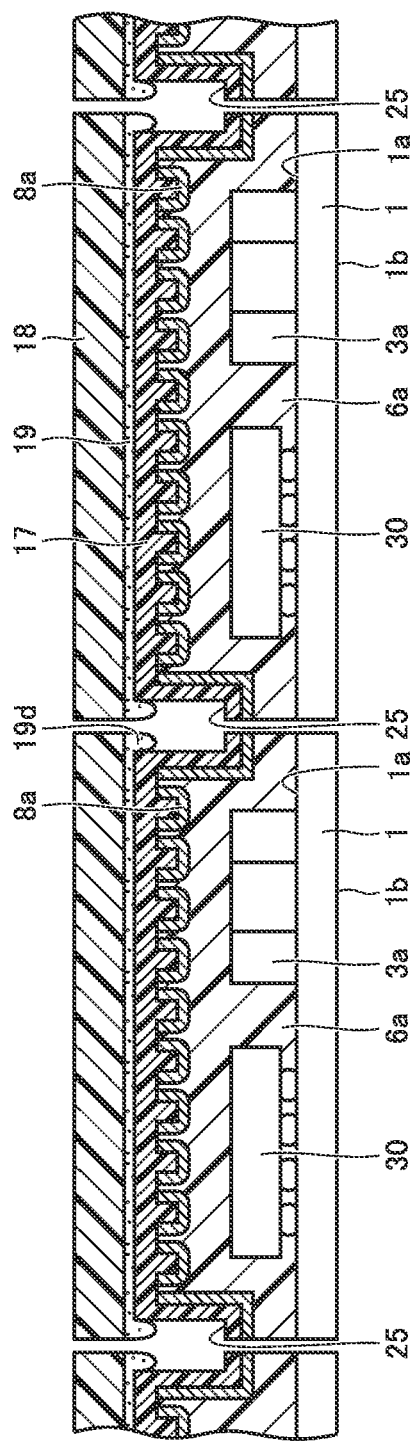
FIG. 22 is an illustrative view of a tenth step in the method of manufacturing a module in the fifth embodiment based on the present disclosure.

In step S7, as shown in FIG. 22, a plurality of module raw materials each including step portion 25 on the outer periphery of first sealing resin 6a are obtained by dividing the integrated substrate to leave a part of groove 26 as step portion 25. The integrated substrate can be divided by dicer machining or laser machining. A part of a material that forms adhesive layer 19 is dragged to form drip portion 19d.

Figure 23:
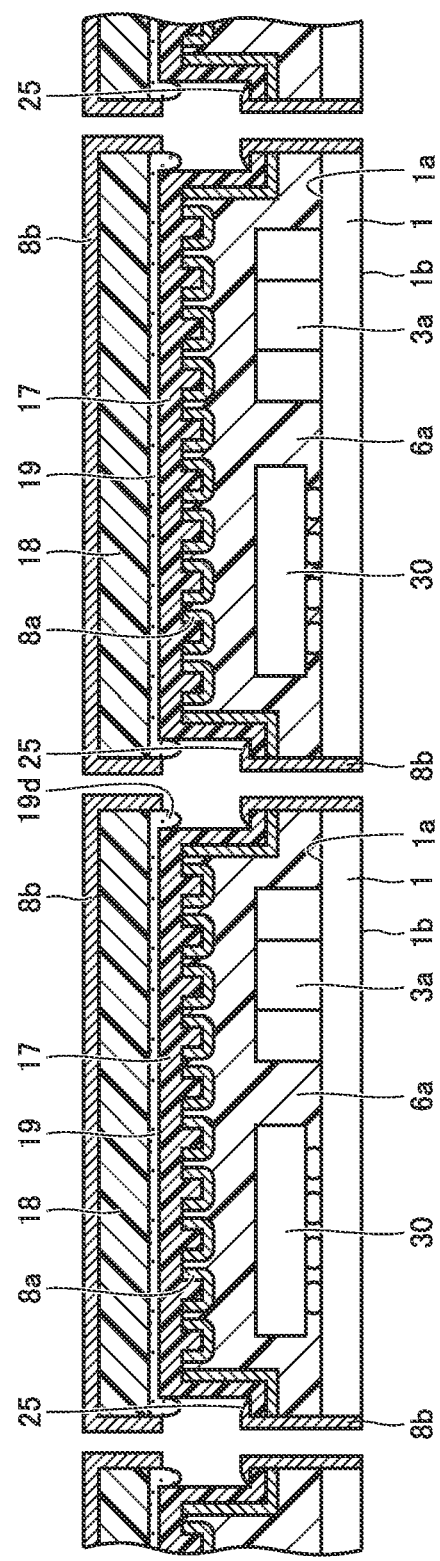
FIG. 23 is an illustrative view of an eleventh step in the method of manufacturing a module in the fifth embodiment based on the present disclosure.

In step S8, as shown in FIG. 23, second shield film 8b is formed to cover first sealing resin 6a and protective sheet 18 in each of the plurality of module raw materials. In forming second shield film 8b with a physical film formation method such as sputtering, an interval between module raw materials should sufficiently be large for reliable formation of second shield film 8b.

Figure 24:
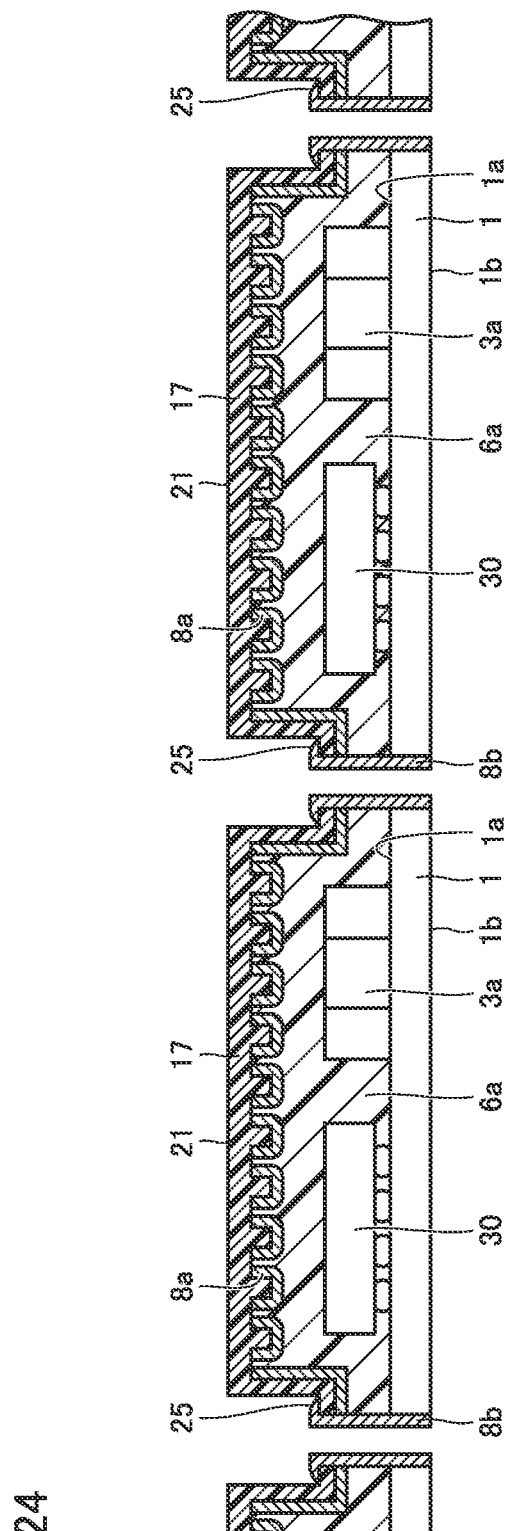
FIG. 24 is an illustrative view of a twelfth step in the method of manufacturing a module in the fifth embodiment based on the present disclosure.

In step S9, protective sheet 18 is removed from each of the plurality of module raw materials. Consequently, a structure shown in FIG. 24 is obtained. FIG. 24 shows a plurality of modules. Module 101 shown in FIG. 3 is one extracted from them.

In the present embodiment, in step S7, the plurality of module raw materials each including step portion 25 on the outer periphery of first sealing resin 6a are obtained by dividing the integrated substrate to leave a part of groove 26 as step portion 25. Therefore, even when the adhesive for protective sheet 18 drips down the side surface at the time of division, the drip portion can remain above step portion 25. Since second shield film 8b is thereafter formed in each of the module raw materials in step S8, second shield film 8b and first shield film 8a can satisfactorily be connected to each other. In other words, defective connection between the shield films due to drip of the adhesive down the side surface can be prevented.

Though manufacturing of module 101 described in the first embodiment is illustrated, modules 102 to 104 described in the second to fourth embodiments can also be manufactured by applying the concept shown in the present embodiment thereto.

Though each embodiment shows an example in which first shield film 8a includes a striped portion, it does not have to include the striped portion. Even in such a case, when formation of the shield film in two or more steps for each part and electrical joint of them to each other is desired for some reasons, the present disclosure is applicable.

Some features in embodiments above may be adopted as being combined as appropriate.

It should be understood that the embodiments disclosed herein are illustrative and non-restrictive in every respect. The scope of the present disclosure is defined by the terms of the claims and is intended to include any modifications within the scope and meaning equivalent to the terms of the claims.

1 substrate; 1a first main surface; 1b second main surface; 3a first component; 6a first sealing resin; 8a first shield film; 8b second shield film; 11 external electrode; 13 columnar conductor; 17 resin protective layer; 18 protective sheet; 19 adhesive layer; 19d drip portion; 21 module upper surface; 22 first upper surface; 25 step portion; 26 groove (along intended division line); 27 groove (for forming stripes); 30 component; 41 (striped) portion; 42 (solid-fill) portion; 100 integrated substrate; 101, 102, 103, 104 module

The invention claimed is:

1. A module comprising:
 a substrate including a first main surface;
 a first component mounted on the first main surface;
 a first sealing resin including a first upper surface, the first component being sealed with the first sealing resin;
 a first shield film covering at least a part of the first upper surface of the first sealing resin; and
 a second shield film covering and directly contacting a side surface of the first sealing resin and covering a side surface of the substrate,
 wherein a step portion lower than the first upper surface of the first sealing resin is provided on an outer periphery of the first sealing resin, and
 wherein the first shield film and the second shield film are electrically connected to each other on a side surface below the step portion.

2. The module according to claim 1, wherein the first component is an inductor, and the first shield film includes a striped portion in the first upper surface of the first sealing resin.

3. The module according to claim 1, wherein the first shield film includes in the first upper surface of the first sealing resin, a portion where a conductor film is provided all over.

4. The module according to claim 1, wherein the first shield film is connected to an inner surface of the second shield film at a position lower than an upper end of the second shield film.

5. The module according to claim 2, wherein the first shield film includes in the first upper surface of the first sealing resin, a portion where a conductor film is provided all over.

6. The module according to claim 2, wherein the first shield film is connected to an inner surface of the second shield film at a position lower than an upper end of the second shield film.

7. The module according to claim 2, wherein the substrate includes a second main surface on a side opposite to the first main surface, a second component is mounted on the second main surface, a second sealing resin is arranged to cover the second main surface and the second component, and the second shield film covers a side surface of the second sealing resin.

8. The module according to claim 3, wherein the first shield film is connected to an inner surface of the second shield film at a position lower than an upper end of the second shield film.

9. The module according to claim 3, wherein the substrate includes a second main surface on a side opposite to the first main surface, a second component is mounted on the second main surface, a second sealing resin is arranged to cover the second main surface and the second component, and the second shield film covers a side surface of the second sealing resin.

10. The module according to claim 4, wherein the substrate includes a second main surface on a side opposite to the first main surface, a second component is mounted on the second main surface, a second sealing resin is arranged to cover the second main surface and the second component, and the second shield film covers a side surface of the second sealing resin.

11. A module comprising:
a substrate including a first main surface;
a first component mounted on the first main surface;
a first sealing resin including a first upper surface, the first component being sealed with the first sealing resin;
a first shield film covering at least a part of the first upper surface of the first sealing resin; and
a second shield film covering and directly contacting a side surface of the first sealing resin and a side surface of the substrate,
wherein a step portion lower than the first upper surface of the first sealing resin is provided on an outer periphery of the first sealing resin,
wherein the first shield film and the second shield film are electrically connected to each other on a side surface below the step portion, and
wherein the substrate includes a second main surface on a side opposite to the first main surface, a second component is mounted on the second main surface, a second sealing resin is arranged to cover the second main surface and the second component, and the second shield film covers a side surface of the second sealing resin.

12. A method of manufacturing a module, the method comprising:
preparing an integrated substrate including a first main surface;
mounting a first component on the first main surface of the integrated substrate;
arranging a first sealing resin to cover the first main surface and the first component;
providing a groove along a line defining a boundary between individual substrates in an upper surface of the integrated substrate;
forming a first shield film to cover at least a part of an upper surface of the integrated substrate;
bonding a protective sheet onto the upper surface of the integrated substrate with an adhesive;
obtaining a plurality of module raw materials each including a step portion on an outer periphery of the first sealing resin by dividing the integrated substrate to leave a part of the groove as the step portion;
forming a second shield film for each of the plurality of module raw materials to cover the first sealing resin and the protective sheet; and
removing the protective sheet from each of the plurality of module raw materials.

* * * * *